United States Patent [19]

Bruckert et al.

[11] Patent Number: 4,552,992

[45] Date of Patent: Nov. 12, 1985

[54] ANALOG SIGNAL VERIFICATION CIRCUIT

[75] Inventors: Edward Bruckert, Maynard; David Conroy, Acton; Richard Ellison, Worcester; Martin Minow, Arlington, all of Mass.

[73] Assignee: Digital Equipment Corporation, Maynard, Mass.

[21] Appl. No.: 560,237

[22] Filed: Dec. 12, 1983

[51] Int. Cl.[4] ...................... H04L 25/02; G06F 15/46
[52] U.S. Cl. ........................... 178/69 G; 179/175.2 D; 371/16; 375/10; 364/551
[58] Field of Search .................. 179/172.2 D; 370/14, 370/13, 15; 178/69 G, 69 L; 340/292; 371/15, 16, 18, 71; 375/10; 304/551, 550

[56] References Cited

U.S. PATENT DOCUMENTS 4,254,469  3/1981  Whitely .............................. 364/571

Primary Examiner—Stafford D. Schreyer
Attorney, Agent, or Firm—Ronald T. Reiling; Frank R. Perillo

[57] ABSTRACT

The present system employs a high speed digital signal processor which is programmed to generate pairs of digitized waveforms, each pair representing a pair of different frequencies in response to coded input signals. Each pair of different digitized waveforms, when converted and combined into an analog signal, represents a "tone pair" as used in major telephone systems. The tone pairs are transmitted through an anti-aliasing filter circuit and therefrom through amplification circuitry to a tone pair decoder of the type used in major telephone systems. At the tone pair decoder the tone pair signals are reconverted into binary signals. The binary signals from the tone pair decoder are transmitted to a data processor in the system under test, whereat they may or may not be further decoded. Ultimately the binary signals are compared with the coded input signals originally sent. In this way, the system which is designed to handle digital signals and which is designed to handle digital to analog conversions, is tested. The test circuit employs components already present in the system, or readily adaptable from the major telephone systems equipment.

6 Claims, 1 Drawing Figure

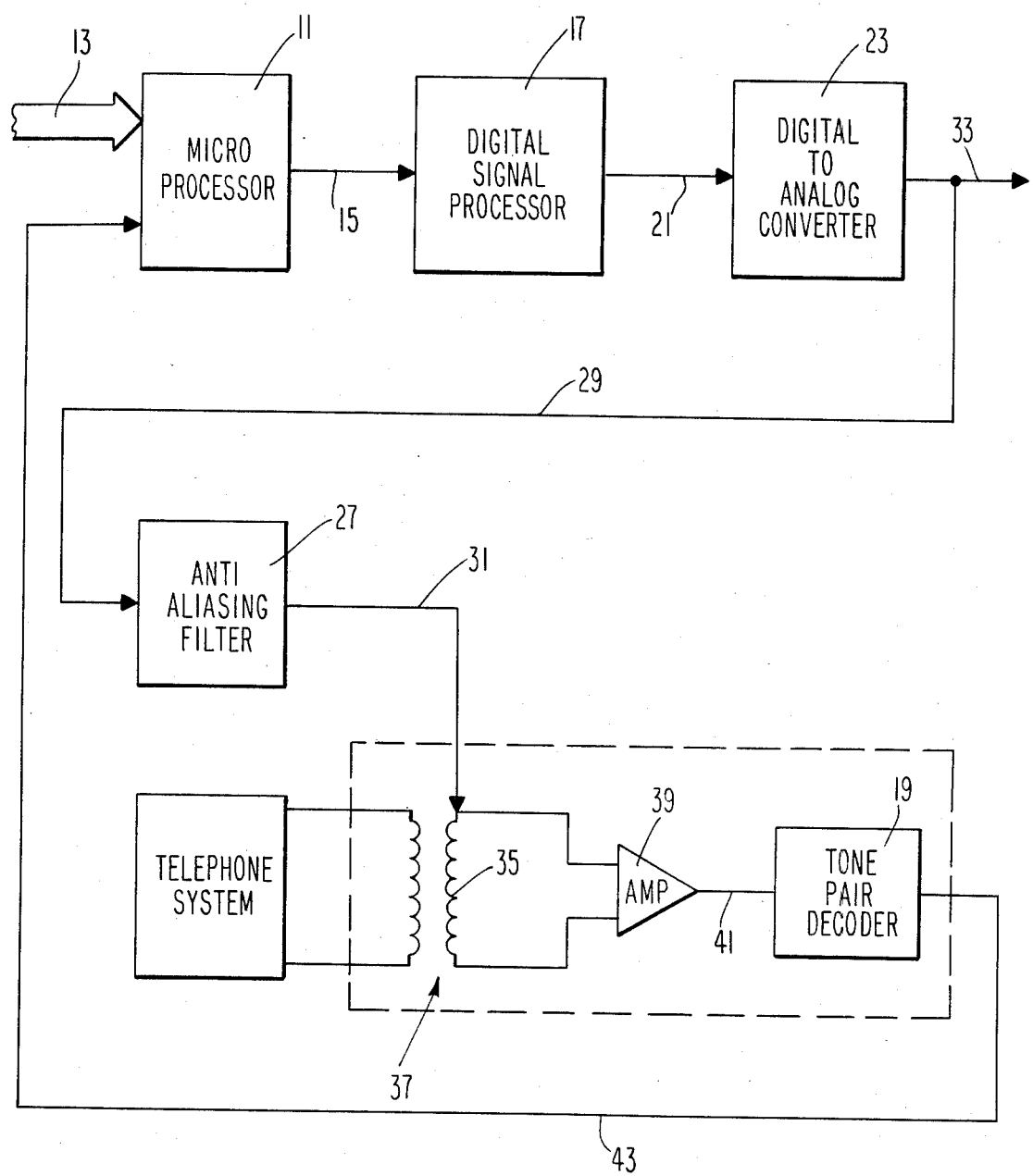

ANALOG SIGNAL VERIFICATION CIRCUIT

BACKGROUND

A major problem in all pulse technique systems, in particular in data processing systems, is the ongoing problem of checking whether or not the system is operating correctly. In purely digital systems, it is a common practice to create, or makeup, small problems which use different segments of the system's circuitry or hardware. These small problems are inserted as steps in lengthy programs. In short, the lengthy programs are interrupted and the short problems are "run." The solutions to the short problems are checked automatically against predetermined answers stored in memory, and if the solutions "check out", the user (or the system) assumes that the system is functioning correctly. In accordance with some other techniques, a problem being run is computed twice, independently and simultaneously, and compared. If a good match is found, the system is assumed to be operating correctly. If, in either of the foregoing techniques, the comparison indicates an error, the system is assumed to be operating incorrectly. It is a common practice in employing such techniques, to program the system to try more than one time if an error is generated.

It is not as simple to verify analog data as it is to verify digital data. However the present system does provide a means, employing already available components, to readily verify that a system, which is handling both digital and analog data signals, is in fact handling such signals correctly, and is in fact handling the transformations thereof correctly.

SUMMARY

The present system is used as a test circuit for a data processing system which has a data processor. The data processor has the capacity to be programmed to generate a series, or a routine, of test signals. The test signals are in coded digital form. The test signals are transmitted to a high speed digital signal processor whereat each is converted into a pair of digitized waveforms, with each of said waveforms representing a different frequency. The two digitized waveforms are combined in the high speed digital signal processor to provide a combined digitized waveform. As should be apparent, the combined digitized waveform represents an analog waveform. Connected to the high speed data processing system is a digital to analog converter, and when the combined waveform (i.e. the two combined digitized waveforms) is transmitted to the digital to analog converter, it is converted into an analog waveform and such a combined analog waveform can effect a tone pair sound at a speaker. The tones, or tone pairs, are the familiar sounds that are heard in the telephone sets of major telephone systems.

The tone pair waveforms are transmitted through an anti-aliasing filter circuit where signal components, in excess of 5000 hertz, are removed. Thereafter the filter tone signal is transmitted to the secondary winding of a transformer in a telephone set employed with the system. The secondary winding is coupled through an amplifier to a tone pair decoder, which is a common component in a telephone set of a major telephone system. The tones, or tone pair signals, are received by the tone pair decoder. If the tone pairs have the proper frequencies the tone pair decoder will decode them, i.e. convert them into digital signals. If the tone pairs do not have the proper frequencies, or if signals, for whatever reason, are sent to the tone pair decoder and do not have the proper frequencies, the tone pair decoder will ignore such signals. After being converted into digital signals such digital signals are transmitted back to the data processor whereat such digital signals are compaired with the test signals sent by the data processor originally.

The objects and features of the present invention will be better understood in view of the following description taken in conjunction with the drawing.

Consider the drawing. In the drawing there is shown a microprocessor 11. Connected to the microprocessor 11 is an input channel 13 over which data signals, address signals and instruction signals are transmitted. The microprocessor 11 in the preferred embodiment is a Motorola 68000. Microprocessor 11 has the capacity to be programmed and in accordance with the present system, the microprocessor 11 is programmed to interrupt a major program being "run" thereon to transmit coded test signals over channel 15 to the digital signal processor 17.

The coded test signals transmitted over the channel 15 may be a series of numerical values, such 0 through 9, or may include some additional alpha-numeric characters, depending upon the capability of the tone pair decoder 19, which will be discussed hereinafter. Assume for the moment that the user has determined that if coded signals, representing the numeral values 0 through 5, are transmitted on channel 15 to the digital signal processor 17, an adequate portion of hardware will be activated to conduct a test. In other words a sufficient amount of the equipment will be employed in handling those coded signals so that the system will be "checked out" as to whether or not it is processing digital signals properly and whether or not the conversion from digital signals to analog signals is being properly done. Accordingly the microprocessor would be programmed to interrupt a long program and send the coded test signals representing the values 0 through 5 to effect a test. The test could be effected during the initialization of the system.

The present system employs the high speed digital signal processor 17 because it has the necessary high speed capacity to generate digitized waveforms in response to the coded digital signals transmitted on channel 15. In the preferred embodiment the digital signal processor 17 is a model 32010 manufactured by Texas Instruments Corporation. In a preferred embodiment the high speed digital signal processor is already present and available for use. When it is suggested that the high speed digital signal processor is already present, it should be understood that the present analog signal verification system is employed with a text to speech system, identified as DECtalk, manufactured by Digital Equipment Corporation. While the present analog signal verification system is used with DECtalk, it should be understood that it could be used with other systems which handle digital signals as well as analog signals, and could be used to verify the correct operation of the hardware in such systems. It should also be understood that other forms of digital signal processors could be used, but such other forms should have the capacity to generate digitized waveforms at high speed because it is generally accepted that the digitized waveforms generator must produce samples at a rate which is twice the value of the highest frequency component which is meaningful. Since human speech is generally considered to have an upper frequency value of 5000 hertz the processor must be able to generate 10,000 samples per second.

The need for the high speed calculations is apparent if we consider that a coded digital signal on channel 15, for instance representing the numeral 2, would cause two digitized waveforms to be generated by the digital signal processor 17 and those two digitized waveforms would be transmitted on channel 21 to the digital to analog converter 23, and if we further consider that the coded digital test signals on channel 15 might be a coded signal with only 8 bits, while the output from the digital signal processor would be two digitized waveforms, each of which, in a preferred embodiment, represents 10,000 groups of 16 bits.

While the digital signal processor 17 generates the two digitized waveforms it also acts to combine those two digitized waveforms into a single waveform. Thereafter the digital signal processor 17 transmits the combined digitized waveform to the digital to analog converter 23. At the digital to analog converter 23, the combined digitized waveform is converted into an analog signal. The analog signal is transmitted from the digital to analog converter along the channel 29 and through the anti-aliasing filter 27 and therefrom to the channel 31. It is well understood that in the transformation of digital signals to analog signals alias signals are always generated. The technique of using an anti-aliasing filter is understood by those skilled in the art. In the present system an anti-aliasing filter 27 is employed to remove alias signals, i.e. signals having frequencies in excess of 5000 hertz.

As mentioned above, in the present system, the pairs of digitized waveforms are combined in the digital signal processor and converted in the digital to analog converter 23 into analog signals. The analog signal is transmitted over the channel 29 to the anti-aliasing filter 27. The filtered analog signal is transmitted on channel 31 to the secondary winding 35 of the transformer 37. From the drawing it is apparent that, the signals on line 31 are transmitted to the secondary 35, although it should be understood they could be transmitted directly to an amplifier and therefrom to the tone pair decoder 19. The present system takes advantage of the fact that, in a telephone set employed with the data processor, there is a tone pair decoder 19 and that tone pair decoder is employed in the present system. The telephone system is employed to permit the microprocessor to talk to the world.

The analog signals are transmitted through the secondary winding 35 to the amplifier 39 whereat they are amplified. The amplified analog signals are transmitted along the channel 41 to the tone pair decoder 19. In a preferred embodiment the tone pair decoder 19 is made up of a pair of chips identified as types 8060 and 8865 manufactured by Mitel Corporation, although it should be understood that any tone pair decoder employed in a major telephone system would suffice. At the tone pair decoder 19, the analog signal is transformed back into coded digital signals and transmitted therefrom along the channel 43 back to the microprocessor 11. In the microprocessor 11 the signals from channel 43 are compared with the original test signals sent as part of the test program. If the digital signals transmitted on channel 43 match the test signals originally sent, then it is assumed that the circuitry and the hardware of the system are operating properly. If, on the other hand, the digitized signals on channel 43 do not match the coded test signals originally transmitted on line 15, then the system and/or the user will assume that the circuitry and/or the hardware handling the digital signals and the digital to analog conversion are not operating properly.

We claim:

1. In a system which produces analog signals from digital signals, and which system includes a data processing means, having input and output means, and which is formed to produce groups of coded digital signals, each group representative of a different character, means to verify that the system is acceptably handling digital signal transmissions, as well as digital to analog transformations, comprising in combination: high speed digital signal processing means, connected through first circuitry means to receive said coded digital signals and formed to have program means which in response to said coded digital signals cause said high speed digital signal processing means to generate, at high speeds, a pair of digitized waveforms, each of said waveforms representing a different frequency; said high speed digital signal processing means further formed to combine said pair of digitized waveforms into a combined waveform signal; digital to analog converter means connected to said high speed digital signal processing means to receive said combined waveform signal therefrom in order to convert said combined waveform signal into an analog waveform signal, whereby said analog waveform signal represents a tone, and said tone represents one of said groups of coded digital signals; tone pair decoder means connected, through second circuitry, to said digital to analog converter, to transform said analog waveform signal received therefrom into a group of coded digital signals; and third circuitry means connecting the said tone pair decoder means to said data processing means to transmit coded digital signals thereto to be compared with said coded digital signals originally sent to said high speed digital signal processing means.

2. A means to verify according to claim 1 wherein said second circuitry means includes an anti-aliasing filter.

3. A means to verify according to claim 2 wherein said anti-aliasing filter is formed to eliminate signal components having a frequency in excess of 5000 hertz.

4. A means to verify according to claim 1 wherein said second circuitry means includes the secondary winding of a transformer of a telephone set.

5. A means to verify according to claim 1 wherein said second circuitry includes an amplifier.

6. In a system which produces analog signals from digital signals, and which system includes a data processing means, having input and output means, and which is formed to produce groups of coded digital signals, each group representative of a different character, a means to verify that the system is acceptably handling digital signal transmissions, as well as digital to analog transformations, comprising in combination: high speed digital signal processing means, connected through first circuitry means to receive said coded digital signals and formed to have program means which in response to said coded digital signals cause said high speed digital signal processing means to generate, at high speeds, a pair of digitized waveforms, each of said waveforms represents a different frequency; said high speed digital signal processing means further formed to combine said pair of digitized waveforms into a combined waveform signal; digital to analog converter means connected to said high speed digital signal processing means to receive said combined waveform signal therefrom in order to convert said combined waveform signal into an analog waveform signal, whereby said analog waveform signal represents a tone, and said tone represents one of said groups of coded digital signals; anti-aliasing filter means connected to said digital to analog converter to filter out signal components over a certain frequency value; amplifier means connected through second circuitry means to said anti-aliasing filter to amplify the signals received therefrom; tone pair decoder means connected to said amplifier means to transform said analog waveform signal received therefrom into a group of coded digital signals; and third circuitry means connecting the said tone pair decoder means to said data processing means to transmit coded digital signals thereto to be compared with said coded digital signal originally sent to said high speed digital signal processing means.

* * * * *